(12) United States Patent
Hong et al.

(10) Patent No.: US 10,665,297 B2
(45) Date of Patent: May 26, 2020

(54) MEMORY SYSTEMS FOR MEMORY DEVICES AND METHODS OF OPERATING THE MEMORY SYSTEMS

(71) Applicant: SK hynix Inc., Icheon-si, Gyeonggi-do (KR)

(72) Inventors: Do-Sun Hong, Icheon-si (KR); Jung Hyun Kwon, Seoul (KR); Won Gyu Shin, Icheon-si (KR); Seung Gyu Jeong, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/236,000

(22) Filed: Dec. 28, 2018

(65) Prior Publication Data
US 2020/0051627 A1 Feb. 13, 2020

(30) Foreign Application Priority Data
Aug. 10, 2018 (KR) .................. 10-2018-0094039

(51) Int. Cl.
| | | |
|---|---|---|
| G11C 13/00 | (2006.01) | |
| G11C 11/56 | (2006.01) | |
| G11C 29/42 | (2006.01) | |
| G06F 13/16 | (2006.01) | |
| G11C 29/04 | (2006.01) | |

(52) U.S. Cl.
CPC ........ *G11C 13/004* (2013.01); *G06F 13/1668* (2013.01); *G11C 11/5678* (2013.01); *G11C 13/0004* (2013.01); *G11C 13/0069* (2013.01); *G11C 29/42* (2013.01); *G11C 2029/0411* (2013.01); *G11C 2211/5644* (2013.01)

(58) Field of Classification Search
CPC .............. G11C 13/004; G11C 11/5678; G11C 13/0004; G11C 13/0069; G11C 29/42; G06F 13/1668
See application file for complete search history.

(56) References Cited

U.S. PATENT DOCUMENTS

2018/0053545 A1* 2/2018 Son .................. G11C 29/42
2018/0232178 A1* 8/2018 Iwaki ................ G06F 3/0659

FOREIGN PATENT DOCUMENTS

KR 1020170099437 A 9/2017

\* cited by examiner

*Primary Examiner* — Tri M Hoang
(74) *Attorney, Agent, or Firm* — Williams Park & Associates Ltd.

(57) ABSTRACT

A memory system includes a memory device and a memory controller. The memory device has a plurality of memory regions. The memory controller is configured to generate a read command for a first memory region corresponding to one of the plurality of memory regions when the number of write commands successively generated for the first memory region reaches a reference value.

19 Claims, 9 Drawing Sheets

MEMORY SYSTEMS FOR MEMORY DEVICES AND METHODS OF OPERATING THE MEMORY SYSTEMS

CROSS-REFERENCE TO RELATED APPLICATIONS

The present application claims priority under 35 U.S.C 119(a) to Korean Application No. 10-2018-0094039, filed on Aug. 10, 2018, which is herein incorporated by references in its entirety.

BACKGROUND

1. Technical Field

Various embodiments of the present disclosure generally relate to memory systems and, more particularly, to memory systems and methods of operating the memory systems.

2. Related Art

Logic levels of data stored in phase change memory (PCM) devices may be determined according to a phase state of a phase changeable material (e.g., a chalcogenide compound material such as a germanium-stibium-tellurium (GST) material) included in each of memory cells of the PCM devices. For example, a certain memory cell may be regarded as a memory cell having a logic "high(1)" level if a phase changeable material included in the certain memory cell has a crystalline state, and the certain memory cell may be regarded as a memory cell having a logic "low(0)" level if the phase changeable material included in the certain memory cell has an amorphous state. The PCM devices exhibit a relatively high operation speed with a high integration density. Thus, the PCM devices may be attractive as a candidate for replacing dynamic random access memory (DRAM) devices in computers or other digital systems. The PCM devices may have a limited lifetime and a limited durability like other nonvolatile memory devices. In particular, the number of write cycles of the PCM devices may be restricted due to a characteristic of the phase changeable material and limitation of design, and the probability of error occurrence may increase as the number of write cycles of the PCM devices increases. Accordingly, it may be important to detect and verify errors that occur during a write operation and a read operation of the PCM devices.

An error correction code (ECC) mechanism is widely used to detect and verify the errors that occur while the PCM devices operate. While the write operation is performed in the PCM devices, write data may be changed into a codeword including parity data by an ECC encoding operation and the codeword may be stored into the memory cells. The codeword stored in the memory cells may be restored into a shape of the original data by an ECC decoding operation while the read operation is performed, During the ECC decoding operation, erroneous data may be detected using the parity data included in the codeword and the erroneous data may be corrected in some cases.

SUMMARY

According to an embodiment, there is provided a memory system. The memory system includes a memory device and a memory controller. The memory device has a plurality of memory regions. The memory controller is configured to generate a read command for a first memory region corresponding to one of the plurality of memory regions when the number of write commands successively generated for the first memory region reaches a reference value.

According to an embodiment, there is provided a memory system. The memory system includes a memory device and a memory controller. The memory device has a plurality of memory regions. The memory controller is configured to generate a read command for data stored in a first memory region corresponding to one of the plurality of memory regions whenever a write command for the first memory region is generated from a point of time that the number of the write command repeatedly generated for the first memory region is equal to or greater than a reference value.

According to an embodiment, there is provided a method of operating a memory system including a memory device having a plurality of memory regions. The method includes counting a current write counting value for a first memory region corresponding to one of the plurality of memory regions to change the current write counting value into an updated write counting value when a write command for the first memory region is generated. The updated write counting value is compared with a reference value, and a read command for the first memory region is generated when the updated write counting value reaches a reference value.

According to an embodiment, there is provided a method of operating a memory system including a memory device having a plurality of memory regions. The method includes counting a current write counting value for a first memory region corresponding to one of the plurality of memory regions to change the current write counting value into an updated write counting value when a write command for the first memory region is generated. The updated write counting value is compared with a reference value, and a read command for the first memory region is generated whenever the write command for the first memory region is generated from a point of time that the updated write counting value is equal to or greater than a reference value.

DETAILED DESCRIPTION

In the following description of the embodiments, it will be understood that the terms "first" and "second" are intended to identify an element, but not used to define only the element itself or to mean a particular sequence. In addition, when an element is referred to as being located "on", "over", "above", "under" or "beneath" another element, it is intended to mean relative position relationship, but not used to limit certain cases that the element directly contacts the other element, or at least one intervening element is present therebetween. Accordingly, the terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

Various embodiments are directed to memory systems having error correction code (ECC) functionality and methods of operating the memory systems.

In the event that an ECC mechanism is applied to operations of memory devices such as PCM devices, detection and correction of erroneous data in the PCM devices may be achieved by an ECC decoding operation. The ECC decoding operation may be performed after a read command of the memory device, for example, the PCM device is generated. Thus, if a plurality of write commands for a certain cell region in a PCM device are successively generated, it may be impossible to verify whether erroneous data for the certain cell region are occurred before the read command for the certain cell region is generated. According to various embodiments of the present disclosure, the PCM devices may be designed such that a read operation for a certain cell region in each of the PCM devices is performed at least once to detect erroneous data in the certain cell region after the plurality of write commands for the certain cell region are successively generated by a predetermined number of times.

Figure 1:
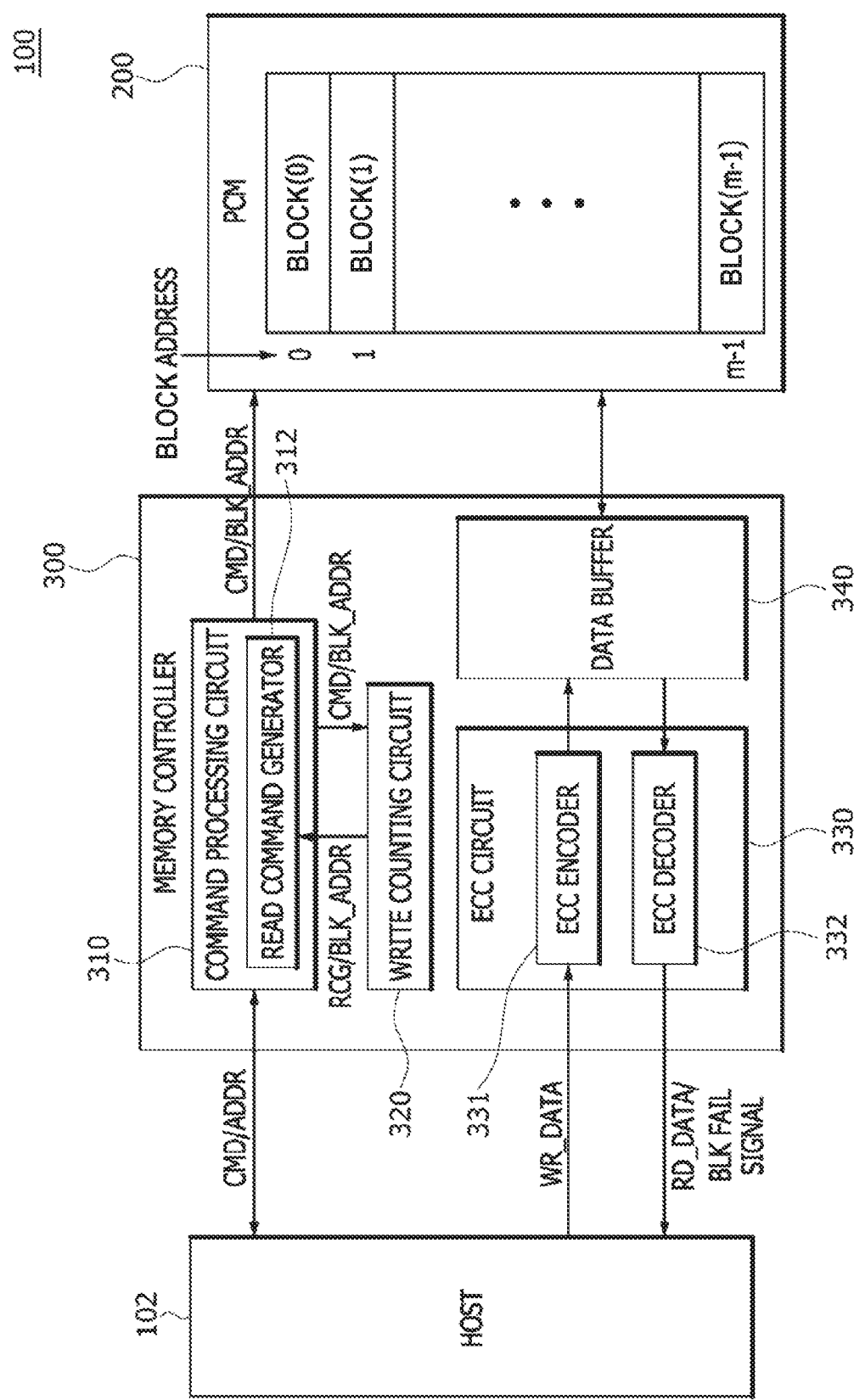
FIG. 1 is a block diagram illustrating a memory system according to an embodiment of the present disclosure.
Figure 2:
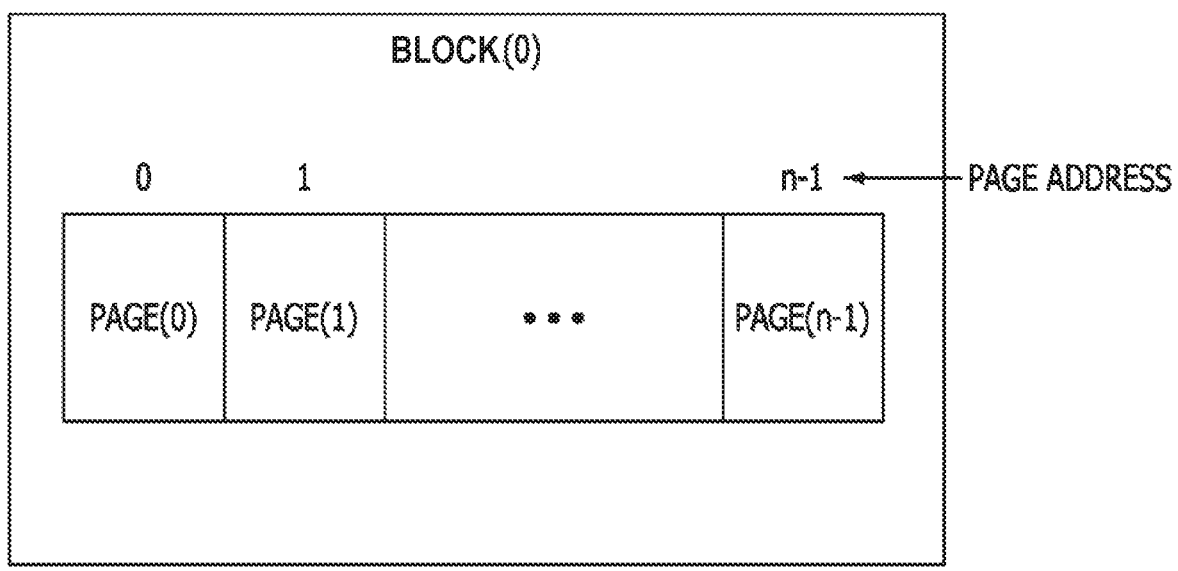
FIG. 2 is a schematic view illustrating a configuration of one among memory blocks of a memory device included in the memory system of FIG. 1.

FIG. 1 is a block diagram illustrating a memory system 100 according to an embodiment of the present disclosure, and FIG. 2 is a schematic view illustrating a configuration of one memory block from among the memory blocks of a memory device 200 included in the memory system 100 of FIG. 1. Referring to FIG. 1, the memory system 100 may be configured to include a PCM device 200 corresponding to a memory device and a memory controller 300 controlling the PCM device 200. In some embodiments the PCM device 200 may be realized by a phase change random access memory (PCRAM) device, and in other embodiments the PCM device 200 may be realized by devices other than the PCRAM device. The PCM device 200 may include a plurality of memory regions, for example, first to $m^{th}$ memory blocks BLOCK(0), BLOCK(1), . . . and BLOCK(m−1). Although an embodiment defines each memory region as a memory block, the present disclosure is not limited thereto. For example, in some other embodiments, the memory regions may be defined as pages which are different from the memory blocks. Each of the memory blocks BLOCK(0), BLOCK(1), . . . and BLOCK(m−1) may be selected by a block address BLOCK_ADDRESS (also, denoted by 'BLK_ADDR'). The first memory block BLOCK(0) corresponding to one of the first to $m^{th}$ memory blocks BLOCK(0), BLOCK(1), . . . and BLOCK(m−1) may be configured to include a plurality of pages, for example, first to $n^{th}$ pages PAGE(0), PAGE(1), . . . and PAGE(n−1), as illustrated in FIG. 2. Each of the first to $n^{th}$ pages PAGE(0), PAGE(1), . . . and PAGE(n−1) may be selected by a page address PAGE_ADDRESS. The first to $n^{th}$ pages PAGE(0), PAGE(1), . . . and PAGE(n−1) may have the same configuration. Each of the second to $m^{th}$ memory blocks BLOCK(1), . . . and BLOCK(m−1) may have the same configuration as the first memory block BLOCK(0).

The memory controller 300 may control a write operation and a read operation of the PCM device 200 based on a command outputted from a host 102. The memory controller 300 may generate the read command regardless of any output signals of the host 102 if write operations for a certain cell region of the PCM device 200 are successively performed a predetermined number of times. The predetermined number of times for the write operations successively performed may be set by users. While the write operations for a certain cell region of the PCM device 200 are successively performed by the number of times which is less than the predetermined number of times, no error detecting/correcting operation is performed. Thus, an interval time between the error detecting/correcting operations (i.e., the ECC decoding operations) may be reduced if the predetermined number of times for the write operations successively performed is reduced, whereas an interval time between the error detecting/correcting operations (i.e., the ECC decoding operations) may increase if the predetermined number of times for the write operations successively performed increases.

The word "predetermined" as used herein with respect to a parameter, such as a predetermined time, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

In an embodiment, the memory controller 300 may be configured to include a command processing circuit 310, a write counting circuit 320, an ECC circuit 330 and a data buffer 340. The command processing circuit 310 may include the read command generator 312. The ECC circuit 330 may include an ECC encoder 331 and an ECC decoder 332. Although not shown in the drawings, the command processing circuit 310, the write counting circuit 320, the ECC circuit 330 and the data buffer 340 constituting the memory controller 300 may be synchronized with a clock signal to operate at appropriate points of the time.

The command processing circuit 310 may receive a command/address signal CMD/ADDR from the host 102 or may output the command/address signal CMD/ADDR to the host 102. The command/address signal CMD/ADDR may include a command CMD and an address ADDR. The command CMD transmitted from the host 102 to the command processing circuit 310 may include the write command or the read command. The address ADDR transmitted from the host 102 to the command processing circuit 310 may include the block address BLK_ADDR for selecting one of the first to $m^{th}$ memory blocks BLOCK(0), BLOCK(1), . . . and BLOCK(m−1) constituting the PCM device 200 and the page address PAGE_ADDRESS for selecting one of the first to $n^{th}$ pages PAGE(0), PAGE(1), . . . and PAGE(n−1)

included in the selected memory block. The command processing circuit 310 may transmit a command/block address signal CMD/BLK_ADDR included in the command/address signal CMD/ADDR to the PCM device 200 and the write counting circuit 320 whenever the command/address signal CMD/ADDR outputted from the host 102 is applied to the command processing circuit 310. If the block address BLK_ADDR and the page address PAGE_ADDRESS are transmitted from the host 102 to the command processing circuit 310, both of the block address BLK_ADDR and the page address PAGE_ADDRESS instead of the block address BLK_ADDR may be transmitted to the PCM device 200 and the write counting circuit 320. This may be equally applied to an embodiment. If the read command is generated by the read command generator 312, the command processing circuit 310 may transmit the read command and the block address BLK_ADDR to the PCM device 200.

The read command generator 312 of the command processing circuit 310 may generate the read command for a certain cell region of the PCM device 200 regardless of the host 102. In order that the read command generator 312 generates the read command, the read command generator 312 may receive a read command generation control signal RCG and a block address BLK_ADDR from the write counting circuit 320. If the read command generation control signal RCG and the block address BLK_ADDR are transmitted from the write counting circuit 320 to the read command generator 312, the read command generator 312 may generate the read command for the certain cell region corresponding to the memory block selected by the block address BLK_ADDR. The command processing circuit 310 may transmit the read command generated by the read command generator 312 and the block address BLK_ADDR provided by the write counting circuit 320 to the PCM device 200.

The write counting circuit 320 may count the number of times of the write operations which are successively performed for each of the first to $m^{th}$ memory blocks BLOCK(0), BLOCK(1), . . . and BLOCK(m−1) included in the PCM device 200. The number of times of the write operations which are successively performed for each of the first to $m^{th}$ memory blocks BLOCK(0), BLOCK(1), . . . and BLOCK(m−1) may correspond to and may be equal to the number of the write commands which are successively generated for each of the first to $m^{th}$ memory blocks BLOCK(0), BLOCK(1), . . . and BLOCK(m−1). The write counting circuit 320 may include a storage circuit for storing the number of the write commands which are successively generated for each of the first to $m^{th}$ memory blocks BLOCK(0), BLOCK(1), . . . and BLOCK(m−1) included in the PCM device 200. Whenever the write command and the block address BLK_ADDR for one (e.g., the first memory block BLOCK(0)) of the memory blocks BLOCK(0), BLOCK(1), . . . and BLOCK(m−1) are transmitted from the command processing circuit 310 to the write counting circuit 320, the write counting circuit 320 may update the number of the write commands successively generated for the first memory block BLOCK(0). If the read command and the block address BLK_ADDR are transmitted from the command processing circuit 310 to the write counting circuit 320, the storage circuit of the write counting circuit 320 may be initialized to reset the number of the write commands successively generated for the first memory block BLOCK(0) to an initial value, for example, zero.

The write counting circuit 320 may compare the number of the write commands successively generated for one (e.g., the first memory block BLOCK(0)) of the memory blocks BLOCK(0), BLOCK(1), . . . and BLOCK(m−1) with a predetermined number. If the number of the write commands successively generated for one (e.g., the first memory block BLOCK(0)) of the memory blocks BLOCK(0), BLOCK(1), . . . and BLOCK(m−1) is equal to the predetermined number, the write counting circuit 320 may generate the read command generation control signal RCG and a value "0" corresponding to the block address BLK_ADDR of the first memory block BLOCK(0). The read command generation control signal RCG and the value "0" corresponding to the block address BLK_ADDR of the first memory block BLOCK(0) may be transmitted to the read command generator 312 included in the command processing circuit 310.

The ECC circuit 330 may perform an operation for correcting erroneous data during the write operation and the read operation of the PCM device 200. The ECC encoder 331 of the ECC circuit 330 may perform an ECC encoding operation of write data WR_DATA outputted from the host 102, according to the write command. Codeword-type write data may be outputted from the ECC encoder 331 by the ECC encoding operation. The codeword-type write data may include the original write data WR_DATA and parity data. The codeword-type write data may be stored into the PCM device 200 through the data buffer 340. The ECC decoder 332 of the ECC circuit 330 may perform an ECC decoding operation of codeword-type read data received from the PCM device 200 through the data buffer 340, according to the read command. The ECC decoder 332 may remove the parity data from the codeword-type read data to generate and output read data RD_DATA. The read data RD_DATA outputted from the ECC decoder 332 may be transmitted to the host 102.

The codeword-type write data outputted from the ECC encoder 331 may be generated to include the parity data that are used to detect and correct erroneous data during the ECC decoding operation performed in a subsequent read operation. That is, the ECC encoding operation may generate only the parity data without executing the error detecting/correcting operation. Thus, only the plurality of write operations are successively performed for a certain memory block of the PCM device 200, it may be impossible to detect whether erroneous data are generated in the certain memory block. The erroneous data generated during the write operation and the read operation of the PCM device 200 may be detected and corrected by the ECC decoding operation. The ECC decoder 332 may detect the erroneous data using the parity data included in the codeword-type read data. If the erroneous data are detected, the ECC decoder 332 may correct the erroneous data within the range of an error correction capability of the ECC circuit 330. In an embodiment, the error correction capability may be defined as the number of maximum erroneous bits (or maximum erroneous symbols) which are correctable using the ECC circuit 330. If the number of erroneous bits (or erroneous symbols) of the erroneous data is greater than the error correction capability of the ECC circuit 330, the ECC decoder 332 may transmit a block fail signal BLK_FAIL_SIGNAL to the host 102 to inform the host 102 that a memory block in which the erroneous data are stored is a failed block.

The data buffer 340 may temporarily store the codeword-type write data outputted from the ECC encoder 331 and may output the codeword-type write data to the PCM device 200, while the write operation is performed. The data buffer 340 may temporarily store the codeword-type read data outputted from the PCM device 200 and may output the codeword-type read data to the ECC decoder 332, while the read operation is performed. In an embodiment, the data buffer 340 may be realized using a volatile memory device such as a dynamic random access memory (DRAM) device or a static random access memory (SRAM) device. Alternatively, the data buffer 340 may be realized using a nonvolatile memory device or using a combined memory device including a nonvolatile memory device and a volatile memory device.

Figure 3:
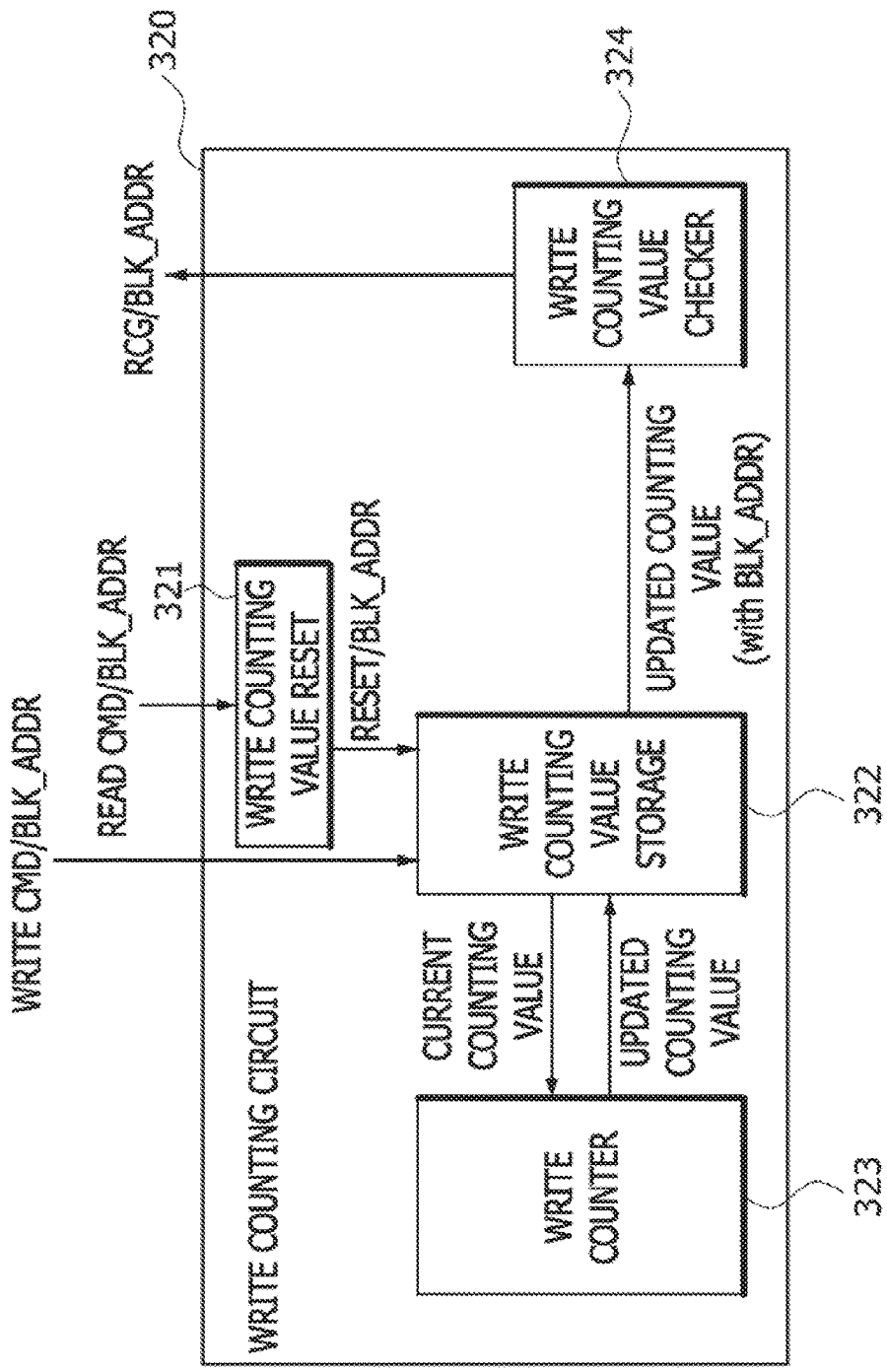
FIG. 3 is a block diagram illustrating a configuration of an example of a write counting circuit included in the memory system of FIG. 1.
Figure 4:
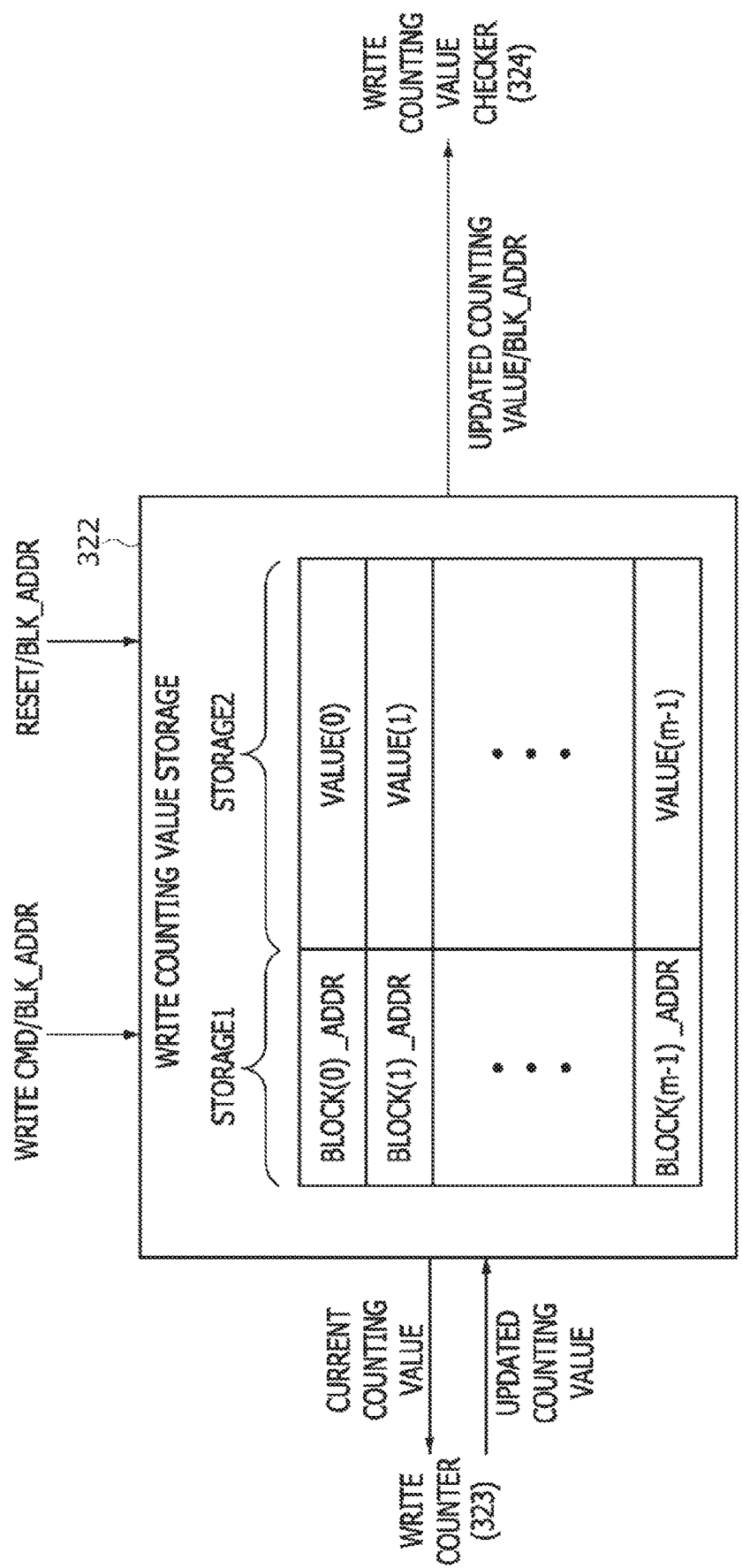
FIG. 4 is a schematic view illustrating a configuration of a write counting value storage circuit included in the write counting circuit of FIG. 3.

FIG. 3 is a block diagram illustrating a configuration of an example of the write counting circuit 320 included in the memory system 100 of FIG. 1. FIG. 4 is a schematic view illustrating a configuration of a write counting value storage circuit 322 included in the write counting circuit 320 of FIG. 3. Referring to FIG. 3, the write counting circuit 320 may be configured to include a write counting value reset circuit 321, the write counting value storage circuit 322, a write counter 323 and a write counting value checker 324. The write counting value reset circuit 321 may receive the read command READ_CMD and the block address BLK_ADDR from the command processing circuit (310 of FIG. 1). The read command READ_CMD may be generated by the host 102 or the read command generator 312. If the read command READ_CMD and the block address BLK_ADDR are inputted to the write counting value reset circuit 321, the write counting value reset circuit 321 may output a reset signal RESET and the block address BLK_ADDR to the write counting value storage circuit 322.

The write counting value storage circuit 322 may store a counted value of the write commands successively generated for each of the first to $m^{th}$ memory blocks BLOCK(0), BLOCK(1), ... and BLOCK(m-1) included in the PCM device 200. As illustrated in FIG. 4, the write counting value storage circuit 322 may have a first storage region STORAGE1 and a second storage region STORAGE2. The first storage region STORAGE1 may include a plurality of block address storage elements that respectively correspond to the first to $m^{th}$ memory blocks BLOCK(0), BLOCK(1), ... and BLOCK(m-1). That is, the first storage region STORAGE1 may include first to $m^{th}$ block address storage elements. In such a case, first to $m^{th}$ block addresses BLOCK(0)_ADDR, BLOCK(1)_ADDR, ... and BLOCK(m-1)_ADDR may be stored in the first to $m^{th}$ block address storage elements, respectively. The second storage region STORAGE2 may include a plurality of write counting value storage elements that respectively correspond to the first to $m^{th}$ block addresses BLOCK(0)_ADDR, BLOCK(1)_ADDR, ... and BLOCK(m-1)_ADDR. That is, the second storage region STORAGE2 may include first to $m^{th}$ write counting value storage elements. In such a case, first to $m^{th}$ write counting values VALUE(0), VALUE(1), ... and VALUE(m-1) respectively corresponding to the first to $m^{th}$ block addresses BLOCK(0)_ADDR, BLOCK(1)_ADDR, ... and BLOCK(m-1)_ADDR may be stored in respective ones of the first to m write counting value storage elements. For example, the first write counting value VALUE(0) stored in the first write counting value storage element may represent the number of the write commands successively generated for any one memory block of the PCM device 200, which is selected by the first block address BLOCK(0)_ADDR.

Referring to FIGS. 3 and 4, the write counting value storage circuit 322 may receive the write command WRITE_CMD and the block address BLK_ADDR from the command processing circuit 310. If the write command WRITE_CMD and the block address BLK_ADDR are inputted to the write counting value storage circuit 322, the write counting value storage circuit 322 may transmit a current write counting value stored in the write counting value storage element corresponding to the inputted block address BLK_ADDR to the write counter 323. The write counting value storage circuit 322 may receive an updated write counting value from the write counter 323. If the updated write counting value is inputted to the write counting value storage circuit 322, the current write counting value stored in the write counting value storage circuit 322 may be replaced with the updated write counting value. In addition, the write counting value storage circuit 322 may transmit both of the updated write counting value and the inputted block address BLK_ADDR to the write counting value checker 324.

The write counter 323 may count up the current write counting value outputted from the write counting value storage circuit 322 by one to generate the updated write counting value which is greater than the current write counting value by one. The updated write counting value may be transmitted from the write counter 323 to the write counting value storage circuit 322. In an embodiment, the write counter 323 may be realized using an adder having a first input terminal, a second input terminal and an output terminal. In such a case, the current write counting value may be applied to the first input terminal of the write counter 323, and a datum "1" may be applied to the second input terminal of the write counter 323. As a result, the write counter 323 may increase the current write counting value by one to provide the updated write counting value and may output the updated write counting value through the output terminal thereof.

The write counting value checker 324 may compare the updated write counting value outputted from the write counting value storage circuit 322 with the predetermined number (also, referred to as a reference value) and may output the read command generation control signal RCG and the block address BLK_ADDR according to the comparison result. If the updated write counting value is less than the reference value, the write counting value checker 324 may interrupt the output of the read command generation control signal RCG and the block address BLK_ADDR. In contrast, if the updated write counting value is equal to or greater than the reference value, the write counting value checker 324 may output the read command generation control signal RCG and the block address BLK_ADDR. The read command generation control signal RCG and the block address BLK_ADDR outputted from the write counting value checker 324 may be transmitted to the read command generator 312.

Figure 5:
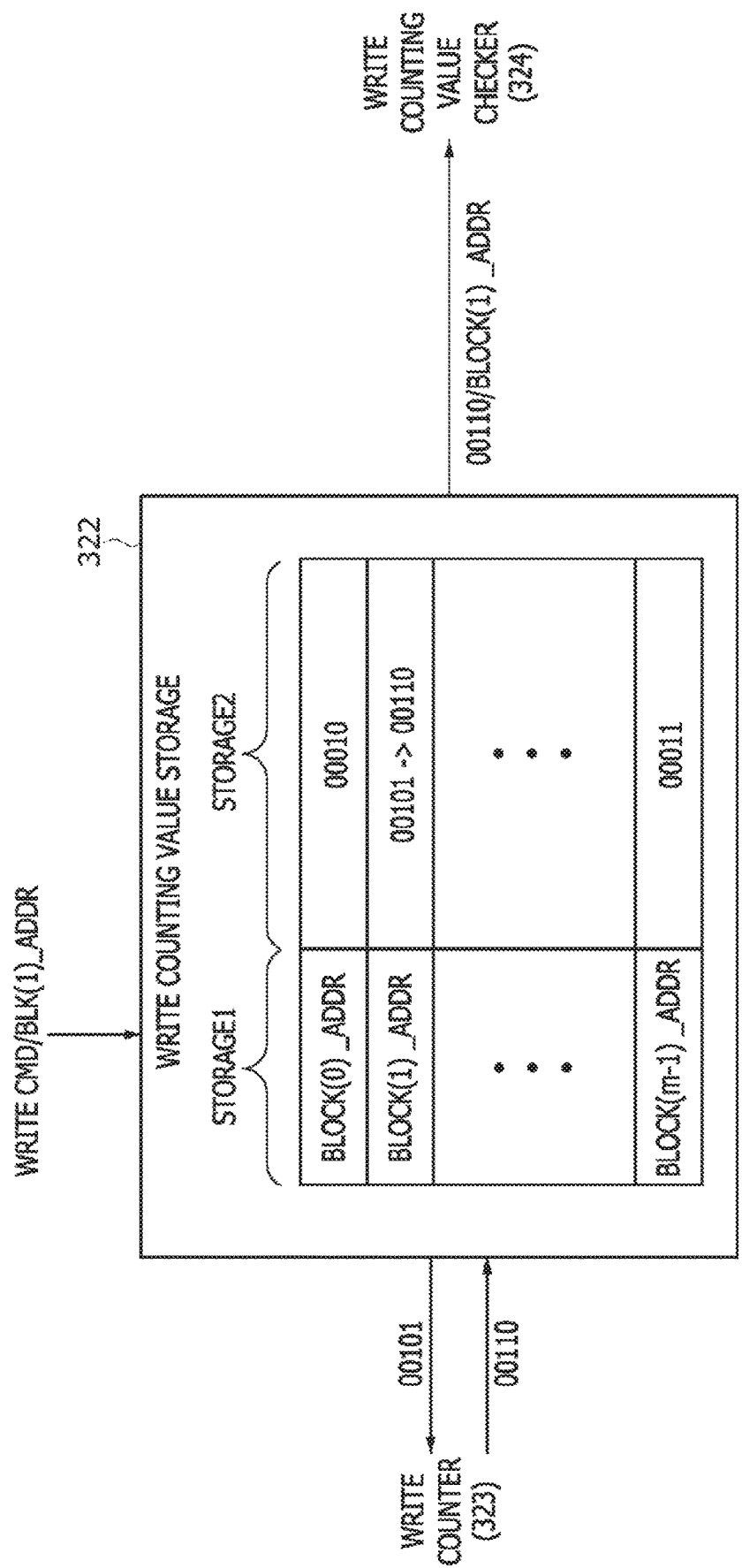
FIG. 5 is a schematic view illustrating an update process of a write counting value in a write counting value circuit according to a write command in a memory system according to an embodiment of the present disclosure.

FIG. 5 is a schematic view illustrating an update process of the write counting value stored in the write counting value storage circuit 322 according to the write command. Referring to FIG. 5, data of '00010' corresponding to the first write counting value may be stored in the first write counting value storage element corresponding to the first block address BLOCK(0)_ADDR. The data of '00010' stored in the first write counting value storage element means that the write command for any one memory block, for example, the first memory block BLOCK(0) of the PCM device 200, which is selected by the first block address BLOCK(0)_ADDR, is successively generated three times. Similarly, data of '00101' corresponding to the second write counting value may be stored in the second write counting value storage element corresponding to the second block address BLOCK(1)_ADDR, and data of '00011' corresponding to the $m^{th}$ write counting value may be stored in the write counting value storage element corresponding to the $m^{th}$ block address BLOCK(m-1)_ADDR. In such a case, if the write command WRITE_CMD for the second memory block BLOCK(1) of the PCM device 200 is generated, the write command WRITE_CMD and the second block address BLOCK(1)_ADDR for the second memory block BLOCK(1) may be transmitted to the write counting value storage circuit 322. The write counting value storage circuit 322 may output the data of '00101' corresponding to the current write counting value to the write counter 323. The write counter 323 may perform an adding operation for increasing the current write counting value of '00101' by one to output data of '00110' as the updated write counting value. The updated write counting value of '00110' may be transmitted to the write counting value storage circuit 322. The write counting value storage circuit 322 may replace the current write counting value of '00101' stored in the second write counting value storage element with the updated write counting value of '00110'. In addition, the updated write counting value of '00110' may be inputted to the write counting value checker 324.

Figure 6:
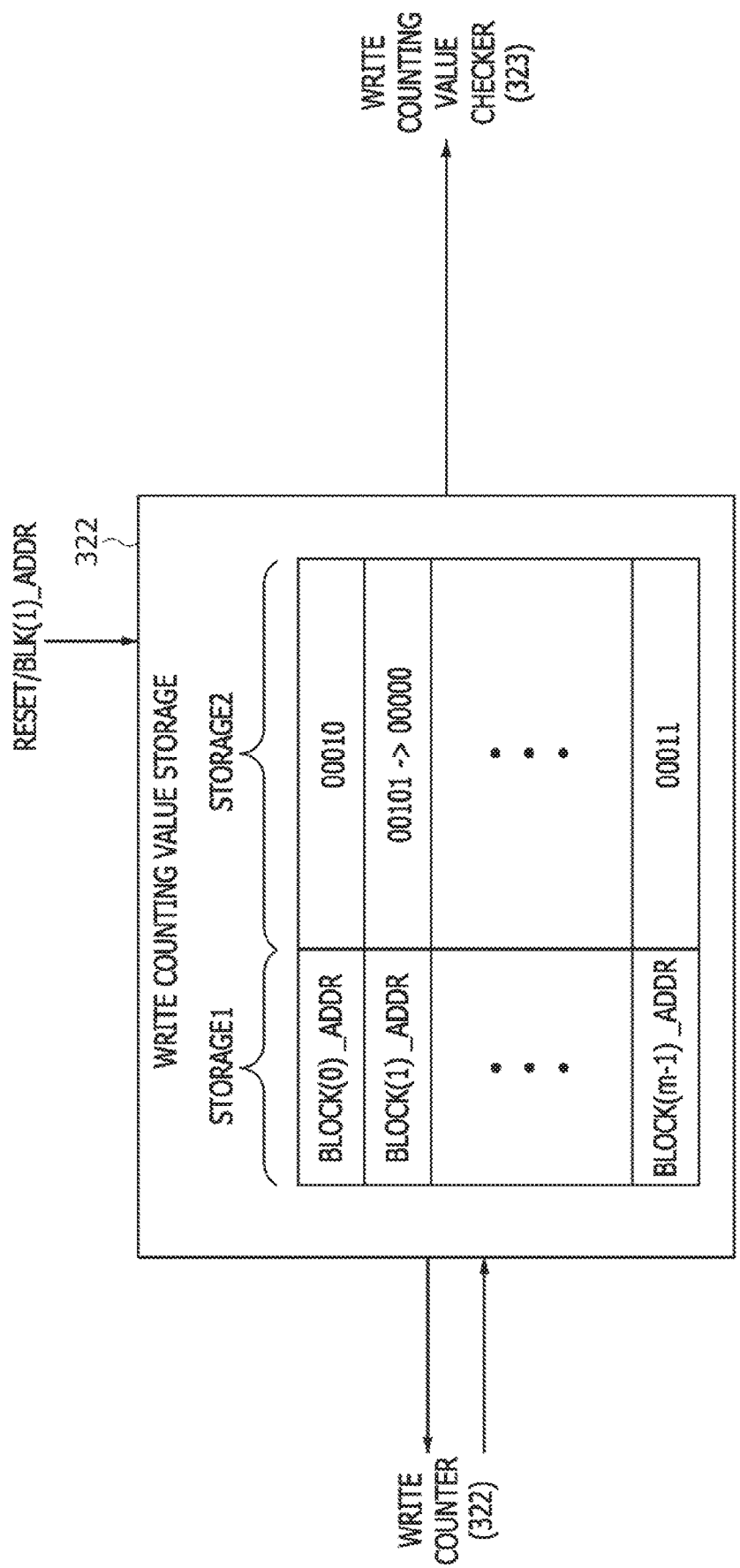
FIG. 6 is a schematic view illustrating a reset process of a write counting value storage circuit according to a reset signal in a memory system according to an embodiment of the present disclosure.

FIG. 6 is a schematic view illustrating a reset process of the write counting value storage circuit 322 according to the reset signal RESET. Referring to FIG. 6, if the read command for the second memory block BLOCK(1) of the PCM device 200 is generated, the write counting value reset circuit 321 may output the reset signal RESET and the second block address BLOCK(1)_ADDR to the write counting value storage circuit 322. If the reset signal RESET and the second block address BLOCK(1)_ADDR are inputted to the write counting value storage circuit 322, the write counting value storage circuit 322 may initialize the data of '00101' corresponding to the current write counting value of the second block address BLOCK(1)_ADDR to an initial value of '00000'.

Figure 7:
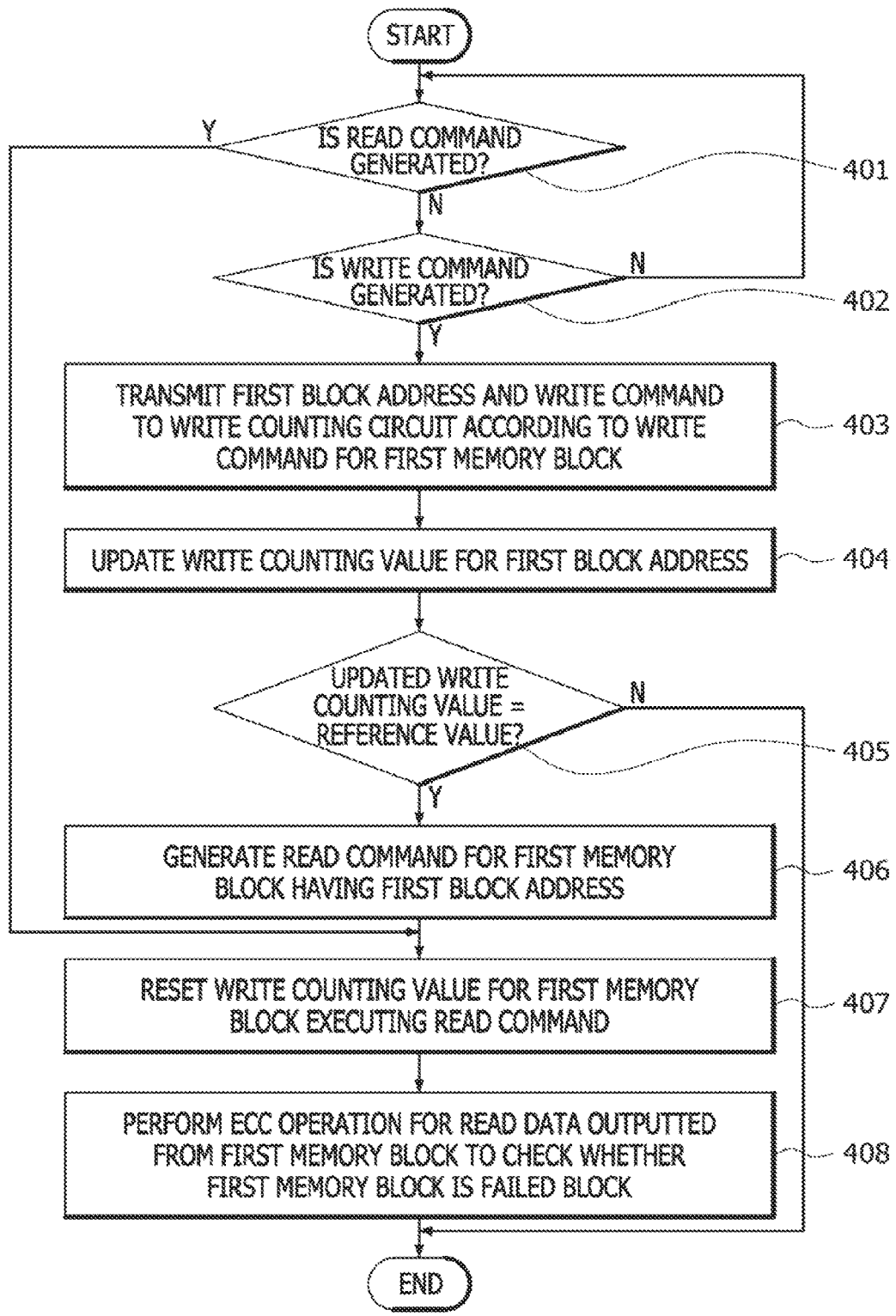
FIG. 7 is a flowchart illustrating an operation of a memory system according to an embodiment of the present disclosure.

FIG. 7 is a flowchart illustrating an operation of a memory system according to an embodiment of the present disclosure. The following description may correspond to an example in which a read command or a write command for any one selected from a plurality of memory blocks of a memory device included in the memory system is generated. The selected memory block may be any one of the first to $m^{th}$ memory blocks BLOCK(0), BLOCK(1), . . . and BLOCK(m-1) included in the PCM device 200. Referring to FIG. 7, whether the read command is generated may be discriminated (see a step 401). If the read command is generated at the step 401, a step 407 may be performed. If no read command is generated at the step 401, whether the write command is generated may be discriminated (see a step 402). If no write command is generated at the step 402, the step 401 may be performed again. If the write command is generated at the step 402, a step 403 may be performed. According to the step 403, the command processing circuit 310 may transmit the first block address BLOCK(0)_ADDR of the first memory block BLOCK(0) and the write command WRITE_CMD to the write counting circuit 320. The write counting circuit 320 may update the write counting value for the first memory block to generate an updated write counting value (see a step 404). As a result, the current write counting value for the first block address BLOCK(0)_ADDR may be replaced with the updated write counting value. The updated write counting value may be compared with the reference value (see a step 405).

If the updated write counting value is equal to the reference value at the step 405, a step 406 may be performed. According to the step 406, the read command for the first memory block BLOCK(0) having the first block address BLOCK(0)_ADDR may be generated. For example, the write counting circuit 320 may output the read command generation control signal RCG and the first block address BLOCK(0)_ADDR to the read command generator 312 included in the command processing circuit 310. The read command generator 312 may generate the read command for the first memory block BLOCK(0) having the first block address BLOCK(0)_ADDR. The command processing circuit 310 may transmit the read command for the first memory block BLOCK(0) to the memory device (i.e., the PCM device 200) to perform the read operation of the first memory block BLOCK(0). Subsequently, the step 407 may be performed. According to the step 407, the write counting value for the first memory block BLOCK(0) executing the read command may be reset to zero. The ECC operation for the read data outputted from the PCM device 200 by the read operation of the first memory block BLOCK(0) may be performed to discriminate whether the first memory block BLOCK(0) is a failed block (see a step 408).

Figure 8:
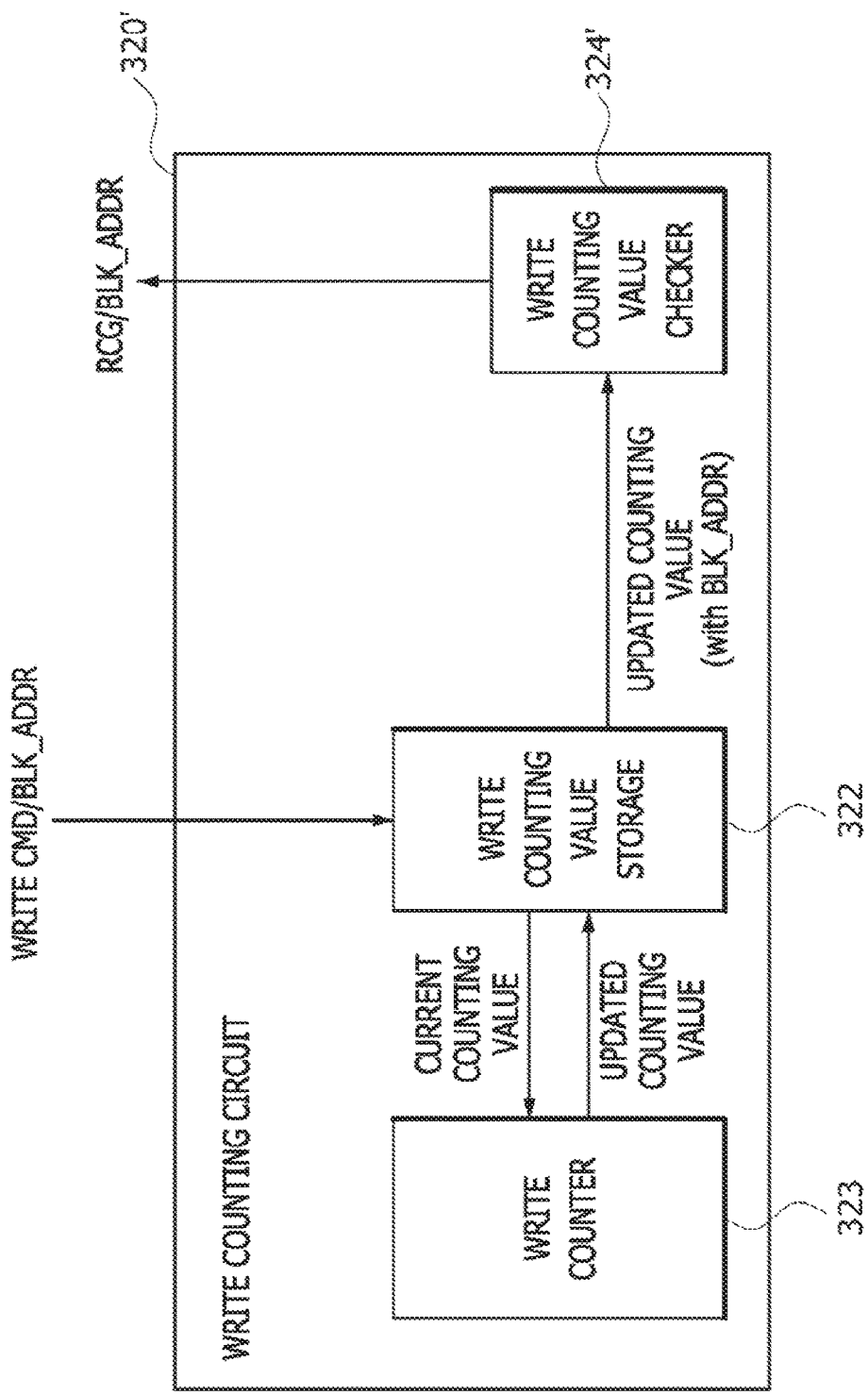
FIG. 8 is a block diagram illustrating a configuration of another example of a write counting circuit included in the memory system of FIG. 1.

FIG. 8 is a block diagram illustrating a configuration of an example of the write counting circuit 320 included in the memory system 100 of FIG. 1. In FIG. 8, the same reference numerals as used in FIG. 3 denote the same elements. Referring to FIG. 8, a write counting circuit 320' corresponding to other examples of the write counting circuit 320 may have substantially the same configuration as the write counting circuit 320 illustrated in FIG. 3 except that the write counting circuit 320' is realized without the write counting value reset circuit (321 of FIG. 3) and the write counting circuit 320' is realized to include a write counting value checker 324' instead of the write counting value checker 324. Since the write counting circuit 320' is realized without the write counting value reset circuit (321 of FIG. 3), the write counting circuit 320' may not perform the reset operation of the write counting values. Thus, if the command CMD and the block address BLK_ADDR are transmitted from the host 102 to the command processing circuit 310, the command processing circuit 310 of the memory system 100 may transmit the command CMD and the block address BLK_ADDR only to the PCM device 200 but not to the write counting circuit 320'.

For example, the write counting value storage circuit 322 may store a counted value of the write commands successively generated for each of the first to $m^{th}$ memory blocks BLOCK(0), BLOCK(1), . . . and BLOCK(m-1) included in the PCM device 200. The write counting value storage circuit 322 may be realized to have the same configuration as described with reference to FIG. 4. The write counting value storage circuit 322 may receive the write command WRITE_CMD and the block address BLK_ADDR from the command processing circuit (310 of FIG. 1). If the write command WRITE_CMD and the block address BLK_ADDR are inputted to the write counting value storage circuit 322, the write counting value storage circuit 322 may transmit a current write counting value stored in the write counting value storage element corresponding to the inputted block address BLK_ADDR to the write counter 323. The write counting value storage circuit 322 may receive an updated write counting value from the write counter 323. If the updated write counting value is inputted to the write counting value storage circuit 322, the current write counting value stored in the write counting value storage circuit 322 may be replaced with the updated write counting value. In addition, the write counting value storage circuit 322 may transmit both of the updated write counting value and the inputted block address BLK_ADDR to the write counting value checker 324'.

The write counter 323 may count up the current write counting value outputted from the write counting value storage circuit 322 by one to generate the updated write counting value which is greater than the current write counting value by one. The updated write counting value may be transmitted from the write counter 323 to the write counting value storage circuit 322. In an embodiment, the write counter 323 may be realized using an adder having a first input terminal, a second input terminal and an output terminal. In such a case, the current write counting value may be applied to the first input terminal of the write counter 323, and a datum "1" may be applied to the second input terminal of the write counter 323. As a result, the write counter 323 may increase the current write counting value by one to provide the updated write counting value and may output the updated write counting value through the output terminal thereof.

The write counting value checker 324' may compare the updated write counting value outputted from the write counting value storage circuit 322 with the predetermined number (also, referred to as a reference value) and may output the read command generation control signal RCG and the block address BLK_ADDR according to the comparison result. If the number of times of the write operations performed for a certain one of the memory blocks included in the PCM device increases, the probability of error occurrence in the certain memory block may increase. Thus, if the probability of error occurrence in the certain memory block is higher than a critical value, it may be necessary to perform the read operation and the ECC operation for the certain memory block after the write operation for the certain memory block is performed. In an embodiment, the reference value may be defined as the number of times of write cycles that causes erroneous data during the write operation for the certain memory block. If the reference value increases, the number of the read operations and the ECC operations performed during a unit time may be reduced but the probability of the error occurrence may become higher. In contrast, if the reference value is reduced, the number of times of the read operations and the ECC operations performed during a unit time may increase but the probability of the error occurrence may be lowered. Thus, it may be necessary to appropriately determine the reference value in consideration of frequencies of the read operations and the ECC operations and the probability of the error occurrence.

If the updated write counting value is less than the reference value, the write counting value checker 324' may interrupt the output of the read command generation control signal RCG and the block address BLK_ADDR. In contrast, if the updated write counting value is equal to or greater than the reference value, the write counting value checker 324' may output the read command generation control signal RCG and the block address BLK_ADDR. The read command generation control signal RCG and the block address BLK_ADDR outputted from the write counting value checker 324' may be transmitted to the read command generator (312 of FIG. 1) included in the command processing circuit (310 of FIG. 1).

According to the operation of the write counting circuit 320', if the updated write counting value for any one (e.g., the first memory block BLOCK(0)) of the first to $m^{th}$ memory blocks BLOCK(0), BLOCK(1), . . . and BLOCK (m-1) included in the PCM device 200 is equal to or greater than the reference value, the write counting value checker 324' may output the read command generation control signal RCG and the block address BLK_ADDR to the read command generator (312 of FIG. 1) included in the command processing circuit (310 of FIG. 1). Thus, the read command generation control signal RCG for the first memory block BLOCK(0) may be generated whenever the write command for the first memory block BLOCK(0) is additionally generated from the point of time that the updated write counting value for the first memory block BLOCK(0) is equal to the reference value. If the read command generation control signal RCG for the first memory block BLOCK(0) is generated, the read operation and the ECC operation of data stored in the first memory block BLOCK(0) may be performed. That is, the read operation and the ECC operation of data stored in the first memory block BLOCK(0) may be performed whenever the write operation for the first memory block BLOCK(0) is performed from the point of time that the updated write counting value for the first memory block BLOCK(0) reaches the reference value.

Figure 9:
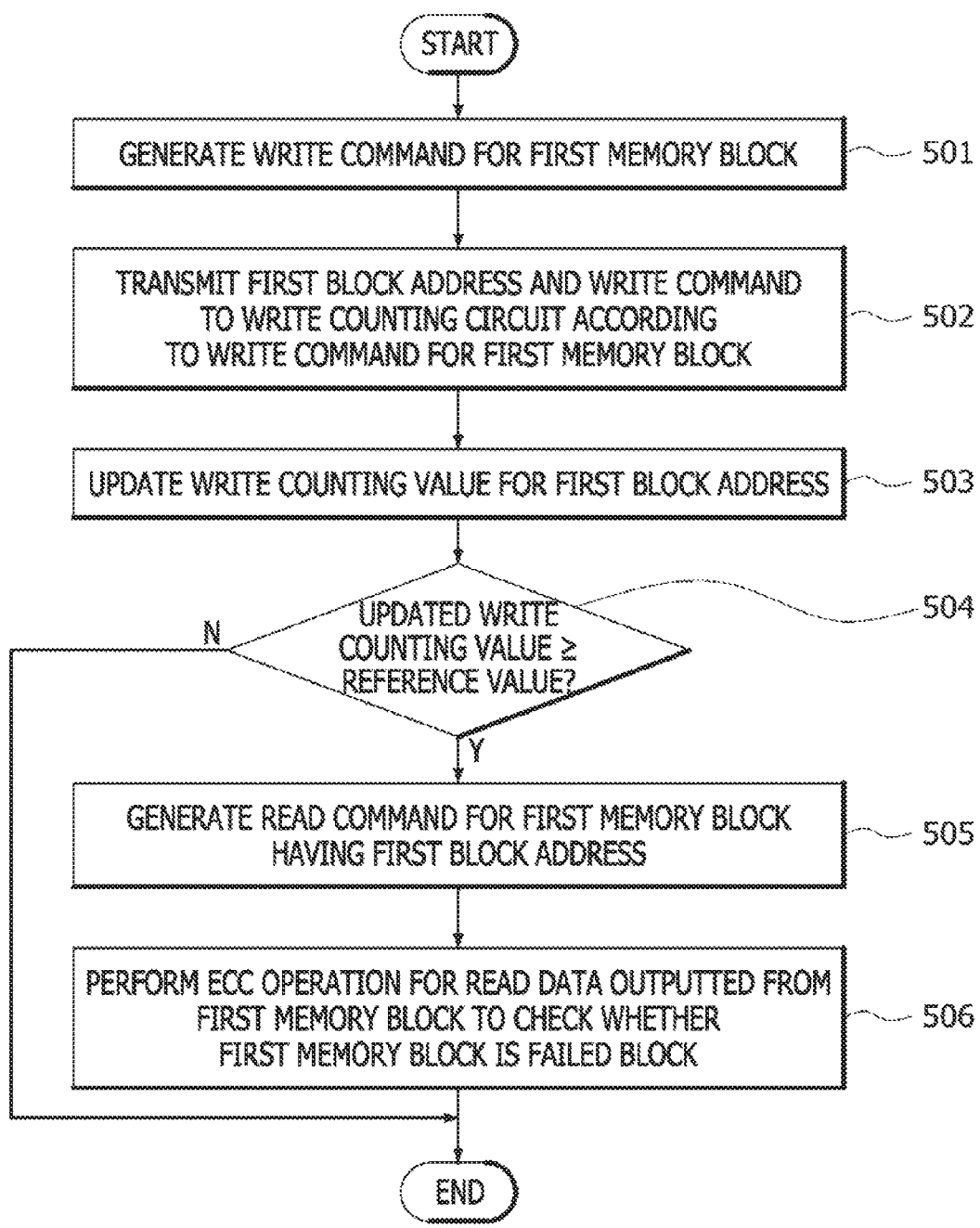
FIG. 9 is a flowchart illustrating an operation of a memory system according to an embodiment of the present disclosure.

FIG. 9 is a flowchart illustrating an operation of a memory system according to an embodiment of the present disclosure. The following description may correspond to an example in which a read command or a write command for any one selected from a plurality of memory blocks of a memory device included in the memory system is generated. The selected memory block may be any one of the first to $m^{th}$ memory blocks BLOCK(0), BLOCK(1), . . . and BLOCK(m-1) included in the PCM device 200 of FIG. 1. Referring to FIG. 9, if the write command for the first memory block BLOCK(0) is generated at a step 501, the first block address BLOCK(0)_ADDR and the write command WRITE_CMD may be transmitted to the write counting circuit (320' of FIG. 8) by the write command for the first memory block BLOCK(0) (see a step 502). The write counting circuit 320' may update the write counting value for the first memory block to generate an updated write counting value (see a step 503). As a result, the current write counting value for the first block address BLOCK(0)_ADDR may be replaced with the updated write counting value. The updated write counting value may be compared with the reference value to discriminate whether the updated write counting value is less than the reference value or not (see a step 504).

If the updated write counting value is less than the reference value at the step 504, no read command for the first memory block BLOCK(0) is generated to terminate a write counting operation. If the updated write counting value is equal to or greater than the reference value at the step 504, the read command for the first memory block BLOCK(0) having the first block address BLOCK(0)_ADDR may be generated (see a step 505). For example, the write counting circuit 320' may output the read command generation control signal RCG and the first block address BLOCK(0)_ADDR to the read command generator 312 included in the command processing circuit 310. The read command generator 312 may generate the read command for the first memory block BLOCK(0) having the first block address BLOCK(0)_ADDR. The command processing circuit 310 may transmit the read command for the first memory block BLOCK(0) to the memory device (i.e., the PCM device 200) to perform the read operation of the first memory block BLOCK(0). Subsequently, the ECC operation for the read data outputted from the PCM device 200 by the read operation of the first memory block BLOCK(0) may be performed to discriminate whether the first memory block BLOCK(0) is a failed block (see a step 506).

According to various embodiments described above, if the number of write commands successively generated for a certain memory region in a memory device is equal to or greater than a reference value, a read command for the certain memory region may be executed with an ECC operation to discriminate whether erroneous data are generated in the certain memory region. As a result, lifetime and durability of the memory device may be improved.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A memory system comprising:
a memory device having a plurality of memory regions; and
a memory controller configured to generate a read command for a first memory region corresponding to one of the plurality of memory regions when a number of write commands successively generated for the first memory region reaches a reference value,
wherein the memory controller includes:
a command processing circuit configured to process a command outputted from a host and configured to generate the read command for the first memory region regardless of the host in response to a read command generation control signal; and
a write counting circuit configured to output the read command generation control signal to the command processing circuit when the number of the write commands successively generated for the first memory region reaches the reference value.

2. The memory system of claim 1, wherein the memory device includes a phase change memory (PCM) device.

3. The memory system of claim 1, wherein the plurality of memory regions include a plurality of memory blocks.

4. The memory system of claim 1, wherein the plurality of memory regions include a plurality of pages.

5. The memory system of claim 1, wherein the command processing circuit includes a read command generator that receives the read command generation control signal and an address of the first memory region from the write counting circuit to generate the read command for the first memory region.

6. The memory system of claim 1, wherein the command processing circuit transmits both of the command and an address of the first memory region to the write counting circuit and the memory device when the command is generated by the host.

7. The memory system of claim 1, wherein the write counting circuit includes:
a write counting value storage circuit configured to store a counted value of the write commands successively generated for each of the memory regions and configured to change and store a current write counting value for the first memory region into an updated write counting value when the write command for the first memory region is transmitted from the command processing circuit to the write counting value storage circuit;
a write counter configured to count the current write counting value outputted from the write counting value storage circuit to generate and output the updated write counting value to the write counting value storage circuit; and
a write counting value checker configured to compare the updated write counting value with the reference value and configured to output the read command generation control signal for the first memory region to the command processing circuit when the updated write counting value is equal to the reference value.

8. The memory system of claim 7,
wherein the write counting circuit further includes a write counting value reset circuit that outputs a reset signal for the first memory region when the read command for the first memory region is transmitted from the command processing circuit to the write counting value reset circuit; and
wherein the write counting value storage circuit is configured to reset a write counting value for the first memory region when the reset signal is transmitted from the write counting value reset circuit to the write counting value storage circuit.

9. The memory system of claim 1, wherein the memory controller further includes an error correction code (ECC) circuit that detects and corrects erroneous data during a read operation of the memory device.

10. The memory system of claim 9, wherein the ECC circuit includes:
an ECC encoder configured to generate codeword-type write data including original write data and parity data during a write operation of the memory device; and
an ECC decoder configured to detect and correct codeword-type read data outputted from the memory device during the read operation.

11. A memory system comprising:
a memory device having a plurality of memory regions; and
a memory controller configured to generate a read command for data stored in a first memory region corresponding to one of the plurality of memory regions whenever a write command for the first memory region is generated from a point of time that a number of the write command repeatedly generated for the first memory region is equal to or greater than a reference value,
wherein the memory controller includes:
a command processing circuit configured to process a command outputted from a host and configured to generate the read command for the first memory region regardless of the host in response to a read command generation control signal; and
a write counting circuit configured to output the read command generation control signal to the command processing circuit whenever the write command for the first memory region is generated when the number of the write command repeatedly generated for the first memory region is equal to or greater than the reference value.

12. The memory system of claim 11, wherein the memory device includes a phase change memory (PCM) device.

13. The memory system of claim 11, wherein the plurality of memory regions include a plurality of memory blocks.

14. The memory system of claim 11, wherein the plurality of memory regions include a plurality of pages.

15. The memory system of claim 11, wherein the command processing circuit includes a read command generator that receives the read command generation control signal and an address of the first memory region from the write counting circuit to generate the read command for the first memory region.

16. The memory system of claim 11, wherein the command processing circuit transmits both of the command and an address of the first memory region to the write counting circuit and the memory device when the command is generated by the host.

17. The memory system of claim 11, wherein the write counting circuit includes:

a write counting value storage circuit configured to store a counted value of the write commands generated for each of the memory regions and configured to change and store a current write counting value for the first memory region into an updated write counting value when the write command for the first memory region is transmitted from the command processing circuit to the write counting value storage circuit;

a write counter configured to count the current write counting value outputted from the write counting value storage circuit to generate and output the updated write counting value to the write counting value storage circuit; and a write counting value checker configured to compare the updated write counting value with the reference value and configured to output the read command generation control signal for the first memory region to the command processing circuit when the updated write counting value is equal to or greater than the reference value.

18. The memory system of claim 11, wherein the memory controller further includes an error correction code (ECC) circuit that detects and corrects erroneous data during a read operation of the memory device.

19. The memory system of claim 18, wherein the ECC circuit includes:

an ECC encoder configured to generate codeword-type write data including original write data and parity data during a write operation of the memory device; and an ECC decoder configured to detect and correct codeword-type read data outputted from the memory device during the read operation.

* * * * *